United States Patent
Kobayashi

[11] Patent Number: 6,157,066
[45] Date of Patent: *Dec. 5, 2000

[54] SEMICONDUCTOR AGGREGATE SUBSTRATE AND SEMICONDUCTOR DEVICE WITH FUSE STRUCTURE TO PREVENT BREAKDOWN

[75] Inventor: Mikiya Kobayashi, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/243,839

[22] Filed: May 17, 1994

[30] Foreign Application Priority Data

May 18, 1993 [JP] Japan ................................. 5-013958

[51] Int. Cl.$^7$ ........................................... H01L 23/62
[52] U.S. Cl. ..................... 257/363; 257/665; 257/360; 257/59; 257/72
[58] Field of Search ................................... 257/665, 363, 257/358, 360, 361, 59, 72

[56] References Cited

U.S. PATENT DOCUMENTS

| | | | |
|---|---|---|---|
| 4,599,639 | 7/1986 | Hynecek | 257/363 |
| 5,068,748 | 11/1991 | Ukai et al. | 257/59 |
| 5,349,227 | 9/1994 | Murayama | 257/361 |
| 5,648,661 | 7/1997 | Rostoker | 257/665 |

FOREIGN PATENT DOCUMENTS

| | | | |
|---|---|---|---|
| 59-9959 | 1/1984 | Japan | 257/363 |
| 63-10558 | 1/1988 | Japan | 257/360 |
| 2198424 | 8/1990 | Japan | 257/363 |

*Primary Examiner*—Jerome Jackson, Jr.
*Attorney, Agent, or Firm*—Hill & Simpson

[57] ABSTRACT

Electrostatic breakdown is avoided during fabrication of individual semiconductor devices using a semiconductor aggregate substrate. The semiconductor aggregate substrate is comprised of a large wafer. A plurality of sections are provided on the surface of the wafer, which are divided by division lines. A display active matrix circuit is integrally formed in each of the segments through normal IC production processing. Guard ring patterns are provided so that they surround the individual display active matrix circuits. A connection pattern is also provided for commonly connecting the guard ring patterns adjoining each other through the division lines. The connection pattern has opening structures for dealing with an external overcurrent on both sides of the division lines. The opening structures are constituted by, for example fuse patterns.

12 Claims, 5 Drawing Sheets

SEMICONDUCTOR AGGREGATE SUBSTRATE AND SEMICONDUCTOR DEVICE WITH FUSE STRUCTURE TO PREVENT BREAKDOWN

BACKGROUND OF THE INVENTION

1. Field of the Invention

The present invention relates to a semiconductor aggregate substrate and semiconductor devices and, more particularly, to an electrostatic charge protection device for a semiconductor aggregate substrate on which a multiplicity of display active matrix circuits are integrally formed. Additionally, the present invention relates to a guard ring structure for an active matrix circuit display.

2. Description of the Related Art

FIG. 5 is a typical plan view showing an example of a conventional semiconductor device. This semiconductor device is a thin film type wherein a semiconductor thin film formed on an insulating substrate 1 is used as a device region. Display active matrix circuits 2 are integrally formed on the surface of the insulating substrate 1. A semiconductor device having such a configuration is used, for example, for liquid crystal display elements of an active matrix type. For example, an active matrix type liquid crystal display element is obtained by joining a counter substrate having counter electrodes formed thereon to the insulating substrate 1 with a predetermined gap therebetween and by filling the gap with a liquid crystal layer. The display active matrix circuits 2 have pixel electrodes 3 arranged in the form of a matrix. A switching thin film transistor 4 is connected to each of the pixel electrodes 3. A gate line 5 is connected to a gate electrode of each of the thin film transistors 4, and a signal line 6 is connected to a source electrode thereof. The plurality of gate lines 5 are connected to a vertical driving circuit 7, and the plurality of signal lines 6 are connected to a horizontal driving circuit 8. The vertical driving circuit 7 line-sequentially selects the switching thin film transistors 4 through the gate lines 5 while the horizontal driving circuit 8 supplies image signals to pixel electrodes 3 corresponding to the selected thin film transistors 4 through the signal lines 6. The vertical driving circuit 7 and the horizontal driving circuit 8 are integrated circuits consisting of thin film transistors. Leading electrodes 9 for external connection are provided at the peripheral portion of the insulating substrate 1 and are connected to the vertical driving circuit 7 and the horizontal driving circuit 8.

Guard ring patterns 10 are formed so that they surround the display active matrix circuits 2 of such a configuration. The guard ring patterns 10 are comprised of metal thin films made of aluminum or the like, and are electrically connected to grounding lines or power supply lines of the circuits 2. The guard ring patterns 10 perform the function of protecting the thin film transistors and the like constituting the display active matrix circuits 2 from electrostatic damage and the like during production.

FIG. 6 is a typical plan view of a semiconductor aggregate substrate on which a plurality of display active matrix circuits as described above are formed. The semiconductor device shown in FIG. 5 can be simultaneously produced in plurality by cutting it off from the semiconductor aggregate substrate. As illustrated, the semiconductor aggregate substrate is constituted by, for example, a rectangular large insulating substrate wafer 11 and has a plurality of segments 13 divided by vertical and horizontal division lines 12. A display active matrix circuit 2 is formed in each of the segments 13 through normal IC processing. As mentioned above, each of the display active matrix circuits 2 is surrounded by the guard ring pattern 10 to be protected from electrostatic damages. Further, a connection pattern 14 is provided to commonly connect the guard ring patterns 10 adjoining each other through division lines 12. All the guard ring patterns on the wafer 11 are commonly connected to share the same electric potential. Such a configuration makes static electricity applied to the wafer 11 during production uniform to prevent electrostatic damage from occurring to the display active matrix circuits 2 in particular segments. The connection pattern 14 is cut during the process of dividing the wafer 11.

Returning to FIG. 5, the problem to be solved by the present invention will be briefly described. The insulating substrate 1 of the semiconductor device has a circumferential end face 20 which corresponds to division lines where it is cut off from the wafer. The connection pattern 14 is left between the circumferential end face 20 and the guard ring pattern 10. The residual connection pattern 14 is not only unnecessary but also harmful to the semiconductor device after separation. Specifically, the connection pattern 14 acts as an antenna which can collect external static electricity, thereby causing electrostatic damage and electrostatic breakdown in the internal circuit. The present invention addresses this problem in the prior art, and it is an object of the present invention to provide a structure which effectively prevents electrostatic breakdown. Although not directly related to the above-described prior art, an example of a pattern for preventing electrostatic breakdown is disclosed in Japanese patent publication No. S58-116673. In that publication, a technique for commonly connecting gate lines and signal lines of display active matrix circuits before dividing a substrate is disclosed.

SUMMARY OF THE INVENTION

In order to solve the above-described problem in the prior art and to achieve the object of the present invention, the present invention is set forth below. A semiconductor aggregate substrate according to the present invention has a basic configuration including a wafer having a plurality of sections divided by predetermined division lines, display active matrix circuits provided in those segments, guard ring patterns provided so that they surround individual display active matrix circuits, and a connection pattern for commonly connecting the guard ring patterns adjoining each other through the division lines. The display active matrix circuit according to the present invention has a display area in which at least pixel electrodes arranged in the form of a matrix and switching elements for driving the same are integrally formed. When the switching elements are formed utilizing thin film transistors, gate lines for supplying selection signals to the thin film transistors and signal lines for supplying image signals are formed. Further, the display active matrix circuit may include a vertical driving circuit connected to the individual thin film transistors through the gate lines in the display area and a horizontal driving circuit connected to the individual thin film transistors through the signal lines. The present invention is characterized in that the connection pattern has opening structures for dealing with an external overcurrent provided on both sides of the division lines. Specifically, the opening structures are constituted by fuse patterns. Alternatively, the opening structure may be constituted by diodes having a reduced gate width.

Semiconductor devices are obtained by dividing a semiconductor aggregate substrate having such a configuration. The semiconductor device includes a substrate having a circumferential end face which has been cut off from the wafer, a display active matrix circuit formed on the substrate, a guard ring pattern disposed so that it surrounds the display active matrix circuit, a part of the connection pattern left between the guard ring pattern and the circumferential end face, and an opening structure for dealing with an external overcurrent.

The semiconductor aggregate substrate according to the present invention includes a connection pattern for commonly connecting individual guard ring patterns to absorb localization of static electricity over the entire surface of the wafer. The connection pattern has opening structures for handling an external overcurrent on both sides of the division lines. The opening structures remain conductive unless an overcurrent is applied so as not to interfere with the common connection between the guard ring patterns. A separated semiconductor device has a part of the connection pattern left thereon between the guard ring pattern and the circumferential end face of the substrate, which includes the opening structure. When an overcurrent due to static electricity or the like flows from the connection pattern which acts as an antenna, the opening structure absorbs the current and becomes electrically open. As a result, it can effectively protect the internal circuit surrounded by the guard ring pattern against electrostatic damage. Further, once this structure opens, the portion of the residual connection pattern acting as an antenna is electrically disconnected from the guard ring pattern. This eliminates the possibility of collecting external static electricity.

DESCRIPTION OF THE INVENTION

Figure 1:
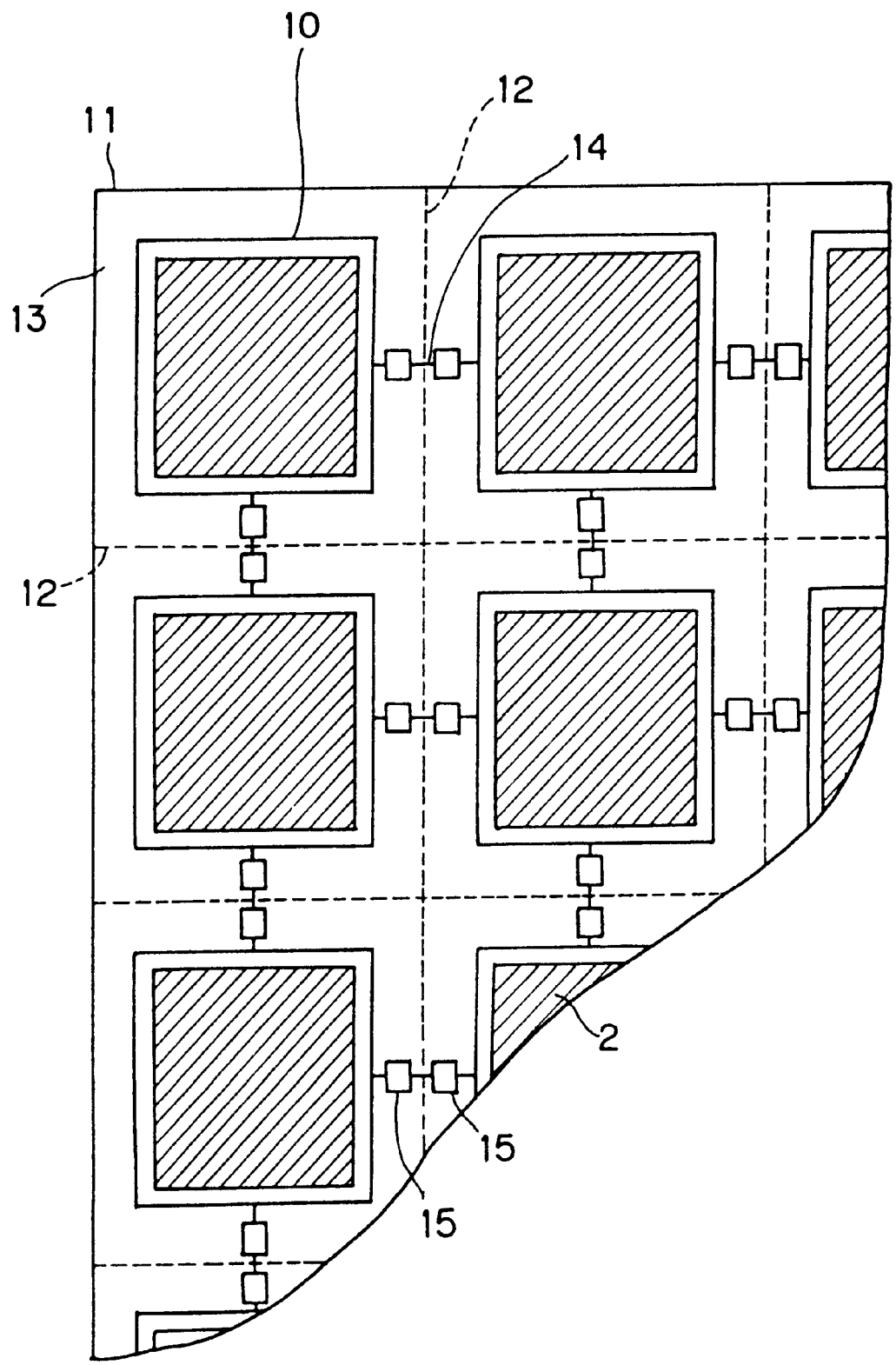
FIG. 1 is a partial plan view showing an embodiment of a semiconductor aggregate substrate according to the present invention.

A preferred embodiment of the present invention will now be described in detail with reference to the accompanying drawings. As illustrated in FIG. 1, a semiconductor aggregate substrate is constituted by a wafer 11 made of, for example, a large rectangular quartz plate. A polycrystalline silicon thin film or the like is formed on the surface of the quartz wafer 11 to provide a device region. The wafer 11 has a plurality of segments 13 divided by predetermined vertical and horizontal division lines 12. A display active matrix circuit 2 is integrally formed in each of the segments 13. Guard ring patterns 10 are provided so that they surround the individual display active matrix circuits 2. The guard ring patterns 10 can be formed by patterning, for example, aluminum thin film used as a material for a wiring electrode and the like. The guard ring patterns 10 adjoining each other through the division lines 12 are commonly connected each other by a connection pattern 14. The connection pattern 14 can be formed by patterning it at the same time when the guard ring patterns 10 are patterned. Such layout allows the guard ring patterns 10 to be maintained at the same electric potential over the entire surface of the wafer 11, thereby effectively suppressing electrostatic build up and preventing electric static damage. The present invention is characterized in that the connection pattern 14 has opening structures for dealing with an external overcurrent provided on both sides of the division lines. The opening structures become open only when an external overcurrent is applied and maintains predetermined conductivity in a normal state. Therefore, the guard ring patterns 10 can be maintained at the same electric potential over the entire surface of the wafer 11 despite the presence of the opening structures 15 on the connection pattern 14. However, the opening structures 15 has a function of opening as soon as an external overcurrent is supplied. Normally, there little possibility that an external overcurrent is will be applied to the wafer 11 before separation.

Figure 2:
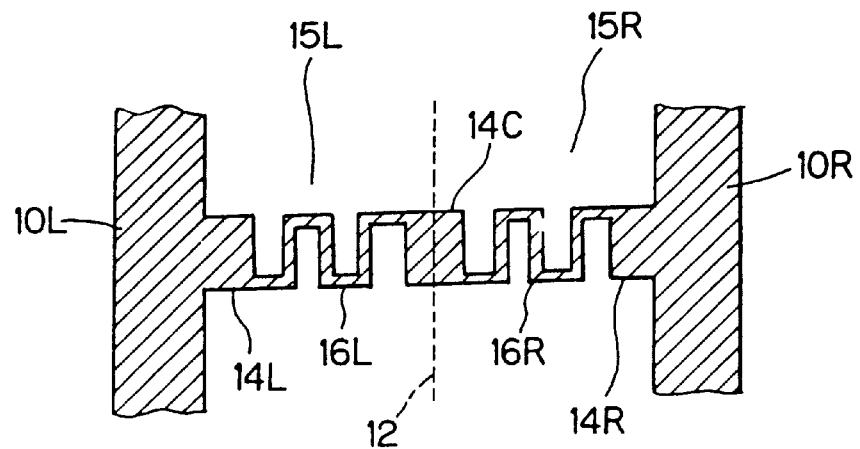
FIG. 2 is a pattern diagram showing a specific example of an opening structure incorporated in the semiconductor aggregate substrate shown in FIG. 1.

FIG. 2 shows a specific example of the opening structure. FIG. 2 shows a pair of opening structures 15L and 15R which are respectively located to the left and right of a division line 12. Hereinafter, suffixes R and L are respectively used for indicating elements located to the right and left of the division line 12 as needed. In this specific example, the opening structure 15 is constituted by a fuse pattern 16. A right-hand side fuse pattern 16R is connected in series between a right-hand side portion 14R and a central portion 14C of the connection pattern while a left-hand side fuse pattern 16L is connected in series between a left-hand side portion 14L and a central portion 14C of the connection pattern. The central portion 14C of the connection pattern is divided along the division line 12 at a later process stage. In this example, the fuse pattern 16 is serpentine and has a line width smaller than the connection pattern 14. Therefore, when an external overcurrent flows due to static electricity or the like from the central portion 14C of the connection pattern which acts as an antenna after separation, heat builds up at the area of the fuse pattern 16 which has relatively high resistance, causing breakage of the wire in but a moment. The fuse pattern 16 can be formed by patterning an aluminum thin film like the connection pattern 14 and the guard ring patterns 10. Alternatively, all of those patterns may be formed from a polycrystalline silicon thin film. Further, although a serpentine configuration is employed in this example to increase the resistance of the fuse pattern, the present invention is not limited thereto. In some cases, a pattern which has been simply reduced in line width may be used.

Figure 3:
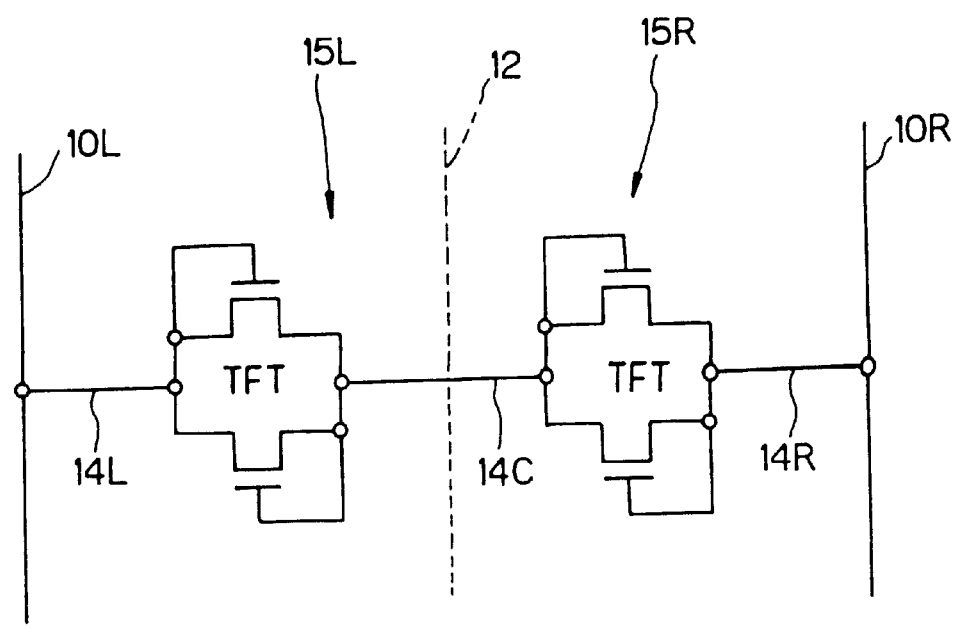
FIG. 3 is a circuit diagram showing another example of an opening structure.

FIG. 3 is a typical view showing another specific example of an opening structure which may be employed in the present invention. An opening structure 15 in this specific example comprises a diode having a reduced gate width. Specifically, it is comprised of a pair of insulated gate field effect transistors (TFT) connected through a diode. The TFT's can be formed simultaneously with the thin film transistors of the display active matrix circuits with no additional burden on the production process. The pair of diode-connected TFT's have opposite polarities and are inserted in the connection pattern 14 so that predetermined bidirectional conductivity is maintained. The TFT's used for the opening structure 15 have a gate width which is reduced compared with normal thin film transistors. Therefore, when an overcurrent flows, they are subjected to dielectric breakdown and open prior to damage of the thin film transistors in the internal circuit. As a result, the internal circuit is protected and, once they open, the side portions 14L and 14R of the connection pattern are disconnected from the central portion 14C.

Figure 4:
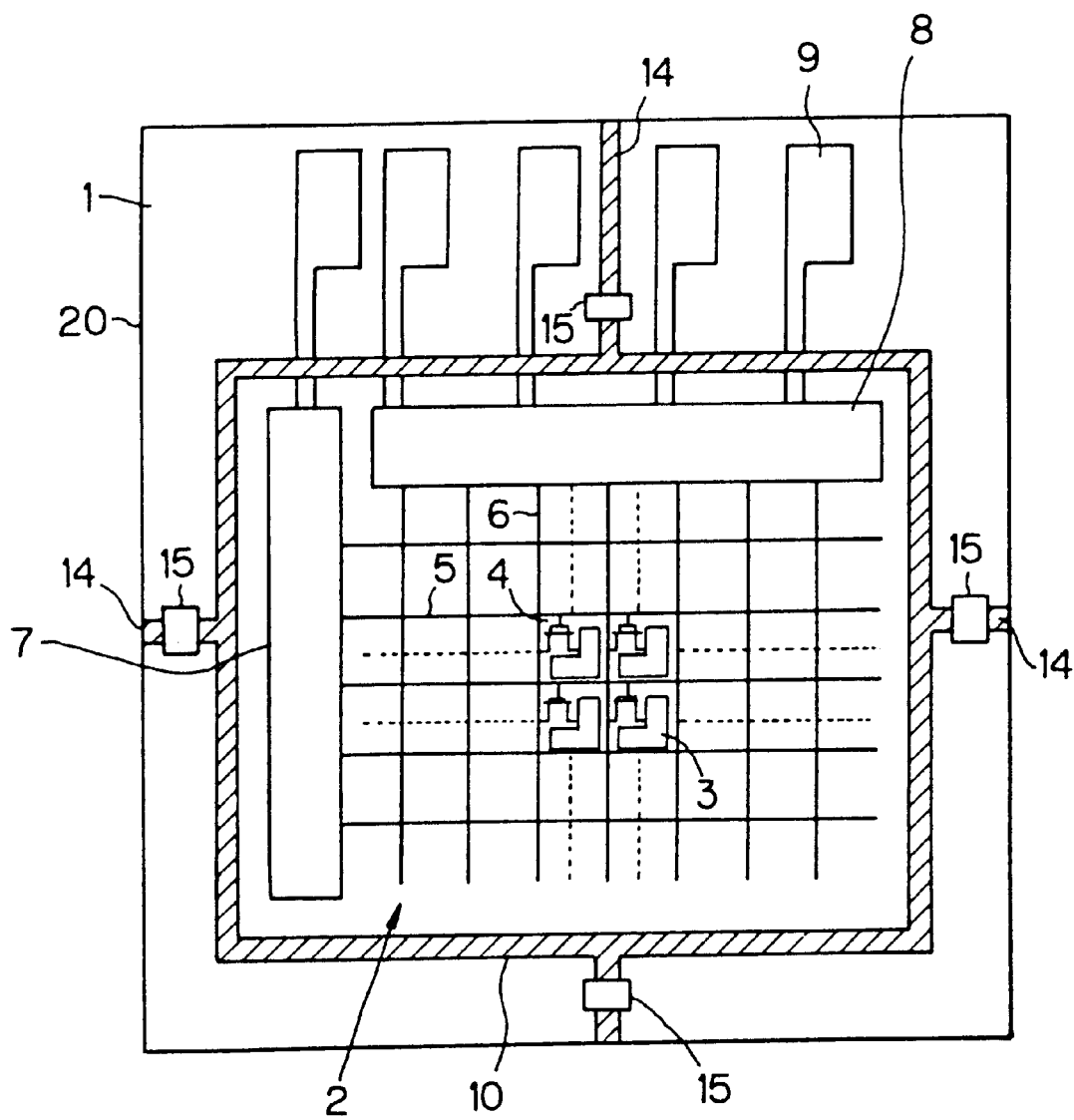
FIG. 4 is a plan view showing an embodiment of a semiconductor device according to the present invention.
Figure 5:
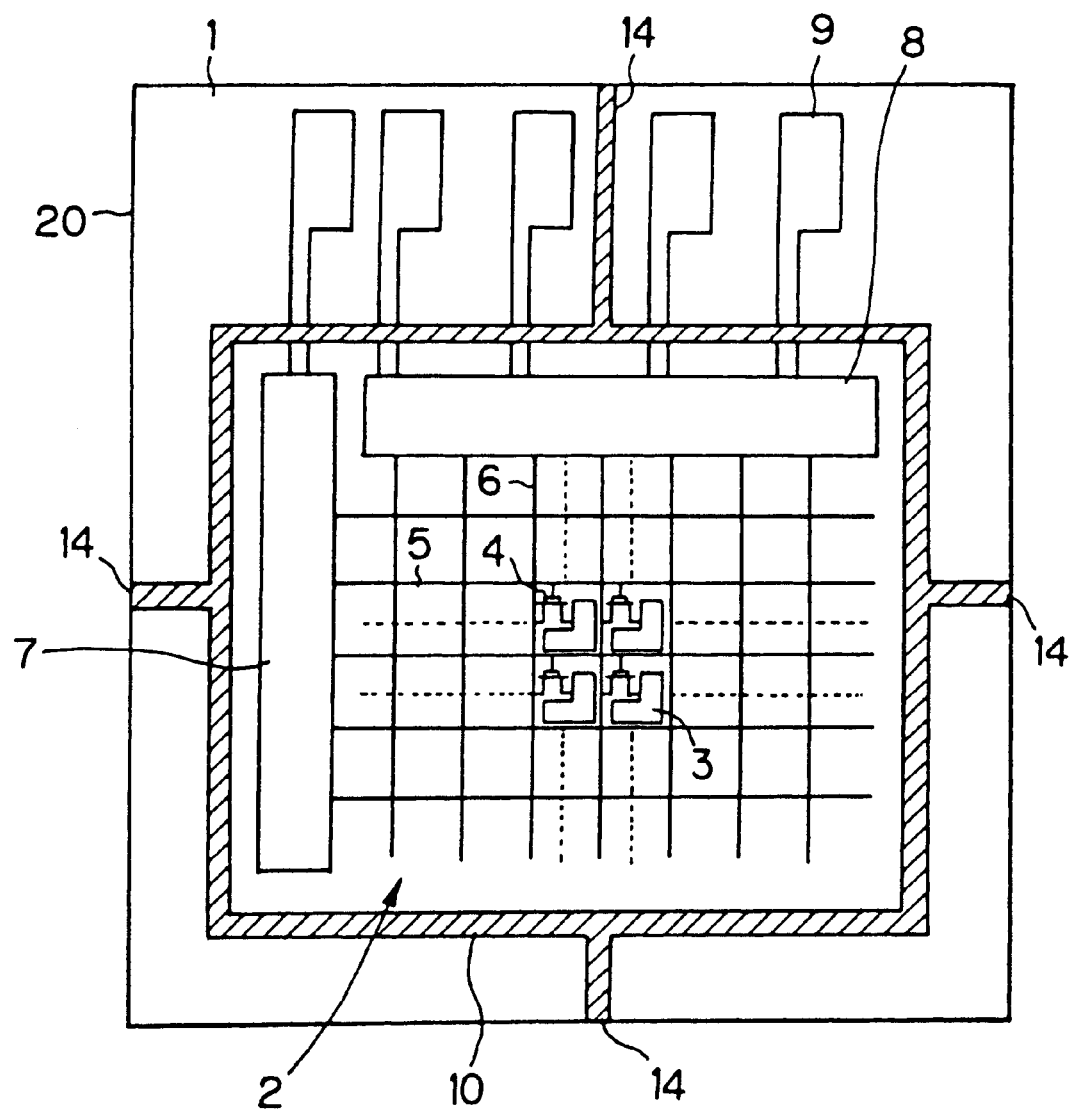
FIG. 5 is a plan view showing an example of a conventional semiconductor device.
Figure 6:
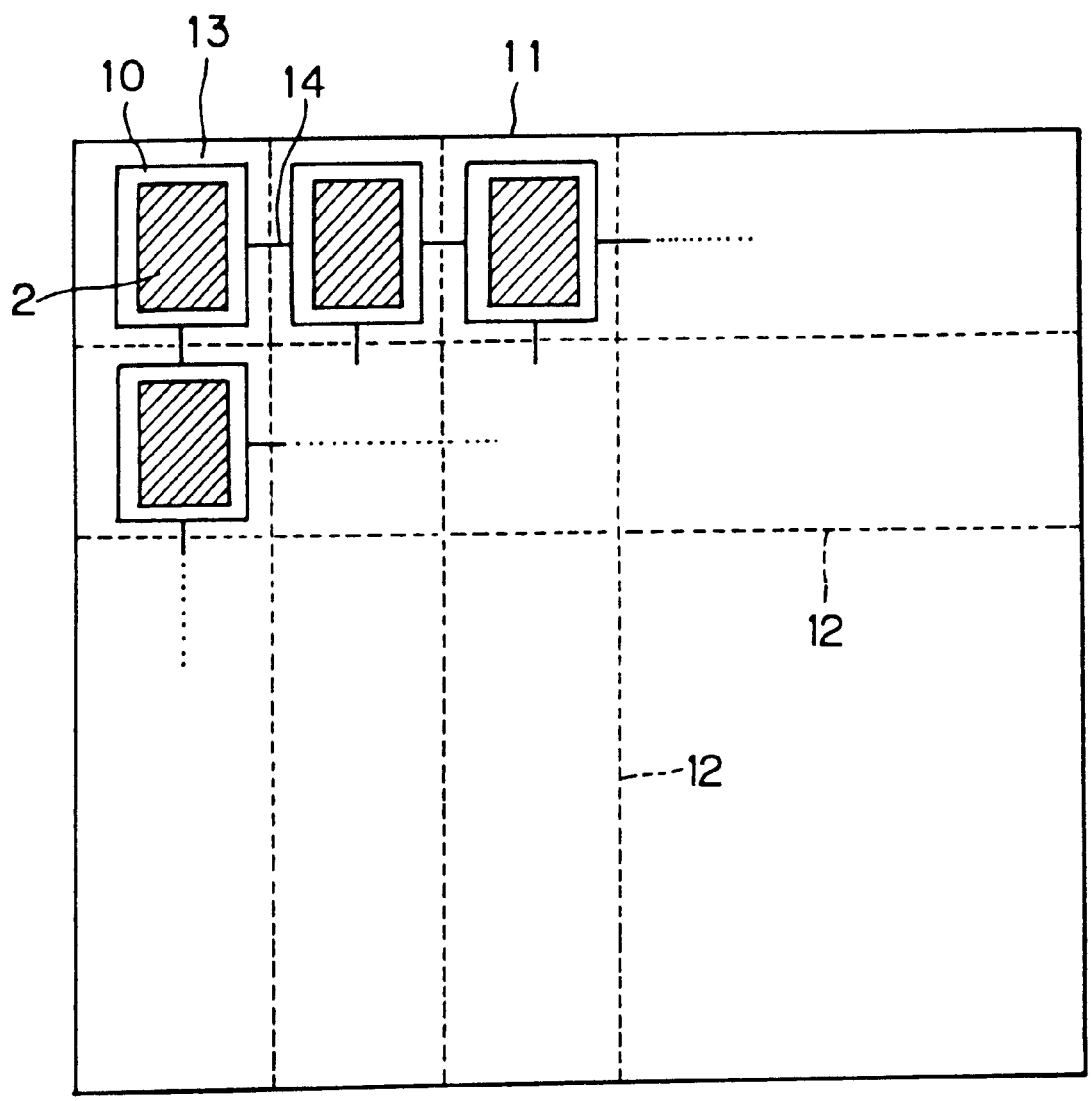
FIG. 6 is a typical plan view showing an example of a conventional semiconductor aggregate substrate.

FIG. 4 is a typical plan view showing an embodiment of a semiconductor device according to the present invention. This semiconductor device is obtained by cutting off one segment of the wafer 11 shown in FIG. 1. An insulating substrate 1 constituting the semiconductor device has a circumferential end face 20 which has been cut off from the wafer. A display active matrix circuit 2 is formed on the surface of the insulating substrate 1. A guard ring pattern 10 is disposed so that it surrounds the display active matrix circuit 2. A part of a connection pattern 14 is left between the guard ring pattern 10 and the circumferential end face 20. The residual connection pattern includes opening structures 15 for protection from an external overcurrent. As previously mentioned, an opening structure 15 may be comprised of a fuse pattern. Alternatively, it may be a bidirectional protective diode having a reduced gate width. The present invention is not limited to such specific examples, and other opening structures may be employed. The opening structure must have a property such that predetermined conductivity is maintained unless an overcurrent is applied and it opens when such an overcurrent is applied. This property allows the structure to open as soon as the end of the connection pattern 14 as an antenna collects external static electricity or the like to protect the internal circuit. Once it opens, the end portion of the connection pattern 14 acting as an antenna is electrically disconnected from the guard ring pattern 10 to prevent it from adversely affecting the circuit.

A display active matrix circuit 2 includes pixel electrodes 3 arranged in the form of a matrix. A switching thin film transistor 4 is connected to each of the pixel electrodes 3. The thin film transistor is of the insulated gate field effect type and has a structure which is relatively weak to static electricity. According to the present invention, breakdown due to such static electricity can be effectively avoided. A gate line 5 is connected to a gate electrode of each of the thin film transistors 4, and a signal line 6 is connected to a source electrode thereof. The plurality of gate lines 5 are connected to a vertical driving circuit 7 while the plurality of signal lines 6 are connected to a horizontal driving circuit 8. The vertical driving circuit 7 line-sequentially selects the switching thin film transistors 4 through the gate lines 5 while the horizontal driving circuit 8 supplies picture signals to the pixel electrodes 3 corresponding to the selected thin film transistors 4. The vertical driving circuit 7 and the horizontal driving circuit 8 are also integrated circuits constituted by thin film transistors. These thin film transistors are also effectively protected from electrostatic breakdown. Leading electrodes 9 for external connection are also formed at a peripheral portion of the insulating substrate and cross the guard ring patterns 10 to be connected to the vertical driving circuit 7 and the horizontal driving circuit 8.

As described above, the connection pattern commonly connecting the adjoining guard ring patterns according to the present invention has opening structures for dealing with an external overcurrent provided on both sides of the division lines. This makes it possible to prevent an overcurrent due to static electricity and the like from flowing from connection patterns left over during or after separation of the wafer, thereby preventing electrostatic breakdown of internal circuit elements. As a result, there is an advantage in that reliability and yield of semiconductor devices can be improved.

While the present invention has been shown and described with reference to the foregoing operational principles and preferred embodiments, it will be apparent to those skilled in the art that other changes in form and detail may be made without departing from the spirit and scope of the invention as defined in the appended claims.

What is claimed is:

1. A semiconductor aggregate substrate comprising:
   a plurality of display active matrix circuits provided on said substrate; and
   a plurality of guard ring patterns, each of said guard ring patterns surrounding a corresponding one of said display active matrix circuits;
   at least one connection between adjacent ones of said guard ring patterns said connection having at least one fuse located therein.

2. The semiconductor aggregate substrate according to claim 1, wherein said fuse is comprised of a patterned layer.

3. The semiconductor aggregate substrate according to claim 1, wherein said at least one fuse is comprised of a diode having a reduced gate width.

4. A semiconductor device comprising:
   a first display active matrix circuit formed on a substrate;
   a first guard ring pattern disposed surrounding said first display active matrix circuit;
   a connection pattern between said first guard ring pattern and a second guard ring pattern; and
   a fuse in said connection pattern.

5. The semiconductor device according to claim 4 wherein said fuse is comprised of a diode.

6. The semiconductor device of claim 4 wherein said guard ring pattern is formed from a metal film.

7. The semiconductor device of claim 4 wherein the first active matrix circuit is further comprised of a first substrate on which pixel electrodes arranged in the form of a matrix and switching elements for driving the same are integrally formed, a second substrate which has counter electrodes is disposed so that it faces said first substrate forming a gap therebetween, and a liquid crystal held in said gap.

8. The semiconductor device of claim 4 wherein the first active matrix circuit is further comprised of a display area in which pixel electrodes arranged in the form of a matrix and switching elements for driving the same are integrally formed, a first substrate formed at the periphery of the display area and having a driving circuit portion formed thereon, a second substrate which has counter electrodes is disposed so that it faces said first substrate to form a gap therebetween, and a liquid crystal held in said gap.

9. A semiconductor substrate having a plurality of electrical circuits formed thereon comprising:
   a corresponding plurality of guard rings, each of said guard rings surrounding a corresponding one of said circuits;
   at least one connection pattern between adjacent ones of said guard rings; and
   at least one fuse structure in the connection pattern.

10. The semiconductor substrate of claim 9, wherein the fuse is further comprised of at least one diode.

11. The semiconductor substrate of claim 9, wherein the fuse is comprised of a patterned layer.

12. The semiconductor substrate of claim 9 comprised of two fuses in the connection pattern, one fuse on each side of a midpoint between the circuits.

* * * * *